(12) United States Patent
Goldberger et al.

(10) Patent No.: US 9,136,060 B2
(45) Date of Patent: Sep. 15, 2015

(54) PRECISION HIGH-FREQUENCY CAPACITOR FORMED ON SEMICONDUCTOR SUBSTRATE

(75) Inventors: Haim Goldberger, Mediin (IL); Sik Lui, Sunnyvale, CA (US); Jacek Korec, San Jose, CA (US); Y. Mohammed Kasem, Santa Clara, CA (US); Harianto Wong, Santa Clar, CA (US); Jack Van Den Heuvel, Los Gatos, CA (US)

(73) Assignee: VISHAY-SILICONIX, Santa Clara, CA (US)

( * ) Notice: Subject to any disclaimer, the term of this patent is extended or adjusted under 35 U.S.C. 154(b) by 55 days.

(21) Appl. No.: 11/966,965

(22) Filed: Dec. 28, 2007

(65) Prior Publication Data

US 2008/0108202 A1 May 8, 2008

Related U.S. Application Data

(60) Division of application No. 11/601,501, filed on Nov. 16, 2006, now Pat. No. 8,004,063, which is a continuation of application No. 10/456,018, filed on Jun. 5, 2003, now Pat. No. 7,151,036, which is a (Continued)

(51) Int. Cl.
*H01L 21/20* (2006.01)
*H01G 4/33* (2006.01)
(Continued)

(52) U.S. Cl.
CPC . *H01G 4/33* (2013.01); *H01G 4/38* (2013.01); *H01L 28/40* (2013.01); *H01L 23/481* (2013.01);

(Continued)

(58) Field of Classification Search
CPC .......... H01G 4/33; H01G 4/38; H01L 29/945; H01L 29/66181
USPC .................................. 438/957, 382, 210, 329
See application file for complete search history.

(56) References Cited

U.S. PATENT DOCUMENTS 3,471,756 A 10/1969 McAfee
4,115,795 A * 9/1978 Masuoka et al. .............. 257/313

(Continued)

FOREIGN PATENT DOCUMENTS

DE 19543540 11/1996
DE 19907525 9/1999

(Continued)

OTHER PUBLICATIONS

Slater, D.B. et al.: "Low Voltage Coefficient Capacitors for VLSI Processes" IEEE Journal of Solid State Circuits, IEEE Inc. New York, US, vol. 24, No. 1, Feb. 1, 1989 pp. 165-173, XP000097242 ISSN: 008-9200, p. 166.

(Continued)

*Primary Examiner* — A. Sefer

(57) ABSTRACT

A method of fabricating a capacitor in a semiconductor substrate. The semiconductor substrate is doped to have a low resistivity. A second electrode, insulated from a first electrode, is formed over a front side surface and connected by a metal-filled via to the back side surface. The via may be omitted and the second electrode may be in electrical contact with the substrate or may be formed on top of the dielectric layer, yielding a pair of series-connected capacitors. ESD protection for the capacitor is provided by a pair of oppositely-directed diodes formed in the substrate connected in parallel with the capacitor. Capacitance is increased while maintaining a low effective series resistance. Electrodes include a plurality of fingers, which are interdigitated with the fingers of other electrode. The capacitor is fabricated in a wafer-scale process with other capacitors, where capacitors are separated from each other by a dicing technique.

18 Claims, 22 Drawing Sheets

Related U.S. Application Data division of application No. 10/208,599, filed on Jul. 29, 2002, now Pat. No. 6,621,143, which is a division of application No. 09/661,483, filed on Sep. 14, 2000, now Pat. No. 6,538,300.

(51) Int. Cl.
*H01G 4/38* (2006.01)
*H01L 49/02* (2006.01)
*H01L 29/94* (2006.01)
*H01L 29/66* (2006.01)
*H01L 23/48* (2006.01)

(52) U.S. Cl.
CPC ......... *H01L 29/66181* (2013.01); *H01L 29/945* (2013.01); *H01L 2224/0401* (2013.01); *H01L 2224/05* (2013.01); *H01L 2224/131* (2013.01); *H01L 2224/13025* (2013.01); *H01L 2924/13091* (2013.01); *Y10S 438/957* (2013.01)

(56) References Cited

U.S. PATENT DOCUMENTS

| | | | |
|---|---|---|---|
| 4,246,502 A | | 1/1981 | Kubinec |
| 4,432,035 A | | 2/1984 | Hsieh et al. |
| 4,751,562 A | | 6/1988 | Yamamura |
| 4,929,989 A | * | 5/1990 | Hayano .................. 257/296 |
| 4,937,660 A | | 6/1990 | Dietrich et al. |
| 4,980,799 A | * | 12/1990 | Tobita .................... 361/311 |
| 5,103,290 A | | 4/1992 | Temple et al. |
| 5,208,726 A | | 5/1993 | Apel |
| 5,352,913 A | | 10/1994 | Chung et al. |
| 5,360,989 A | | 11/1994 | Endo |
| 5,414,284 A | | 5/1995 | Baxter et al. |
| 5,539,613 A | | 7/1996 | Yamamichi et al. |
| 5,706,163 A | | 1/1998 | Kalb et al. |
| 5,808,855 A | | 9/1998 | Chan et al. |
| 5,811,868 A | | 9/1998 | Bertin et al. |
| 5,841,182 A | | 11/1998 | Linn et al. |
| 5,879,984 A | | 3/1999 | Shin et al. |
| 5,889,299 A | | 3/1999 | Abe et al. |
| 5,965,928 A | | 10/1999 | Nagura |
| 5,970,321 A | | 10/1999 | Hively |
| 6,020,637 A | | 2/2000 | Karnezos |
| 6,034,392 A | | 3/2000 | Joo |
| 6,075,290 A | | 6/2000 | Schaefer et al. |
| 6,103,585 A | * | 8/2000 | Michaelis et al. ............ 438/386 |
| 6,146,882 A | | 11/2000 | Uematsu et al. |
| 6,146,992 A | | 11/2000 | Lauterbach et al. |
| 6,225,651 B1 | | 5/2001 | Billon |
| 6,278,158 B1 | | 8/2001 | Pastor et al. |
| 6,303,957 B1 | | 10/2001 | Ohwa |
| 6,359,234 B1 | | 3/2002 | Kouda |
| 6,392,290 B1 | | 5/2002 | Kasem et al. |
| 6,441,424 B1 | | 8/2002 | Klose et al. |
| 6,538,300 B1 | | 3/2003 | Goldberger et al. |
| 6,621,142 B2 | | 9/2003 | Goldberger et al. |
| 6,621,143 B2 | | 9/2003 | Goldberger et al. |
| 7,151,036 B1 | | 12/2006 | Goldberger et al. |
| 8,004,063 B2 | | 8/2011 | Goldberger et al. |

FOREIGN PATENT DOCUMENTS

| | | | |
|---|---|---|---|
| EP | 234384 | * | 9/1987 |
| EP | 0412514 | | 2/1991 |
| EP | 887854 | | 12/1998 |
| EP | 0926723 | | 6/1999 |
| GB | 2060253 | | 4/1981 |
| JP | 61-263251 A | | 11/1986 |
| JP | 62-111443 | | 5/1987 |
| JP | 63-239939 A | | 10/1988 |
| JP | 64-074719 A | | 3/1989 |
| JP | 02-270311 A | | 11/1990 |
| JP | 5-29574 A | * | 2/1993 |
| JP | 5029574 | | 2/1993 |
| JP | 09064275 | | 3/1997 |
| JP | 9-275189 | * | 9/1997 |
| JP | 10-039019 | | 10/1998 |
| JP | 10-93023 | * | 10/1998 |
| JP | 10-335368 A | | 12/1998 |
| JP | 10-336022 A | | 12/1998 |
| JP | 2003-1334475 | | 5/2003 |
| RU | 2101803 | | 1/1998 |
| WO | 98/43298 | | 10/1998 |
| WO | 98/49298 | | 11/1998 |
| WO | 99/57761 | | 11/1999 |

OTHER PUBLICATIONS

Patent Abstracts of Japan, vol. 2000, No. 8, Oct. 6, 2000, & JP 2000 150810 A (Toshiba Corp), May 30, 2000.

Patent Abstract of Japan vol. 1997, No. 01, Jan. 31, 1997 & JP 08 236698 A) NEC Eng: Ltd) Sep. 13, 1996.

Chang, E. Y. et al.: "A Hybrid Wafer-Dicing Process for GaAs MMIC Production" IEEE Transactions on Semiconductor Manufacturing, IEEE Inc, New York, US, vol. 4, No. 1, Feb. 1, 1991, pp. 66-68, XP000177719, ISSN: 0894-6507.

Gupta, A. et al.: "Yield Considerations for Ion-Implanted GaAs MMIC's" IEEE Transactions on Electron Devices, IEEE Inc. New York, US, vol. ED-30, No. 1, 1983, pp. 16-20, XP000199138, ISSN: 0018-9383.

Sumitani, K. et al.: "A High Aspect Ratio Via Hole Dry Etching Technology for High Power GaAs MESFET" Proceedings of the Gallium Arsenide Integrated Circuit Symposium (GaAs IC) San Diego, Oct. 22-25, 1989, New York, IEEE, US, vol. Symp. 11, Oct. 22, 1989, pp. 207-210, XP000090403.

* cited by examiner

PRECISION HIGH-FREQUENCY CAPACITOR FORMED ON SEMICONDUCTOR SUBSTRATE

CROSS-REFERENCE TO RELATED APPLICATIONS

This is a divisional of U.S. patent application Ser. No. 11/601,501 filed on Nov. 16, 2006, which is a Continuation of U.S. patent application Ser. No. 10/456,018 filed on Jun. 5, 2003, which is a Divisional application of U.S. patent application Ser. No. 10/208,599 filed on Jul. 29, 2002, and that issued as U.S. Pat. No. 6,621,143 on Sep. 16, 2003, which is a Divisional application of U.S. patent application Ser. No. 09/661,483 filed on Sep. 14, 2000, and that issued as U.S. Pat. No. 6,538,300 on Mar. 25, 2003, each of which are incorporated herein by reference in their entirety.

This invention is related to application Ser. No. 09/545,287 by Kasem et al., filed Apr. 7, 2000, entitled "Vertical Structure And Process For Semiconductor Wafer-Level Chip Scale Packages", which is incorporated herein by reference in its entirety.

FIELD OF THE INVENTION

This invention relates to semiconductor technology and in particular to the formation of a high-frequency capacitor on a semiconductor substrate.

BACKGROUND OF THE INVENTION

Higher frequencies are increasingly being used in communications technology. For example, frequencies in the range of 450 MHz to 3 GHz are used in cellular communications and frequencies in the range of 10 0 Hz to 18 0 Hz are used in satellite video and data transmission.

These applications require small, precise capacitors. Multi-layer ceramic capacitors have been employed for this purpose, but they tend to be lacking in precision and performance. Thin film capacitors have improved precision and performance but they are expensive.

Accordingly, there is a need for a precision high-frequency capacitor that can be manufactured at a reasonable cost.

SUMMARY OF THE INVENTION

In accordance with this invention, a precision high-frequency capacitor is formed on a heavily-doped semiconductor substrate having first and second principal surfaces. The capacitor includes a dielectric layer on the first principal surface of the substrate and a main electrode layer on the dielectric layer. A conductive layer is formed on the second principal surface of the substrate. A via containing a conductive material extends through the substrate. A second electrode layer is formed over the first principal surface of the substrate, adjacent an opening of the via. The second electrode is electrically connected to the conductive layer by means of the conductive material in the via. Thus, when a voltage difference is applied to the electrodes, the main electrode layer and the substrate act as the "plates" of the capacitor, separated by the dielectric layer.

In an alternative embodiment, the via is omitted, and the second electrode layer, electrically insulated from the first electrode layer, is formed over the first principal surface of the substrate. In one version, the second electrode is separated from the substrate by the dielectric layer, creating in effect a pair of series-connected capacitors, with the substrate representing the common terminal between the capacitors. In another version, the second electrode is in electrical contact with the substrate, creating a single capacitor. Each of the electrode layers may include a plurality of fingers, with the fingers being interdigitated. The dielectric layer, often an oxide, may be thinner under the fingers than under the "palm" portions of the electrode layers from which the fingers protrude.

Capacitors in accordance with this invention exhibit numerous advantages as compared with prior art capacitors. They can be fabricated at a wafer level with a very low effective series resistance (ESR). They can function at very tight tolerances (e.g., <2%) throughout their operational range and can operate at very high frequencies (e.g., up to 5 GHz and higher). They can have a quality (Q) factor, for example, that is much higher than 1000 at 1 MHz.

BRIEF DESCRIPTION OF THE DRAWINGS

This invention will be best understood by reference to the following drawings, in which like components have the same reference numeral. The drawings are not necessarily drawn to scale.

FIGS. 2A-2J illustrate the steps of a process that can be used to fabricate the capacitor of FIG. 1.

DETAILED DESCRIPTION OF THE INVENTION

The principles of this invention will be described by reference to the following embodiments, which are illustrative only.

Figure 1:
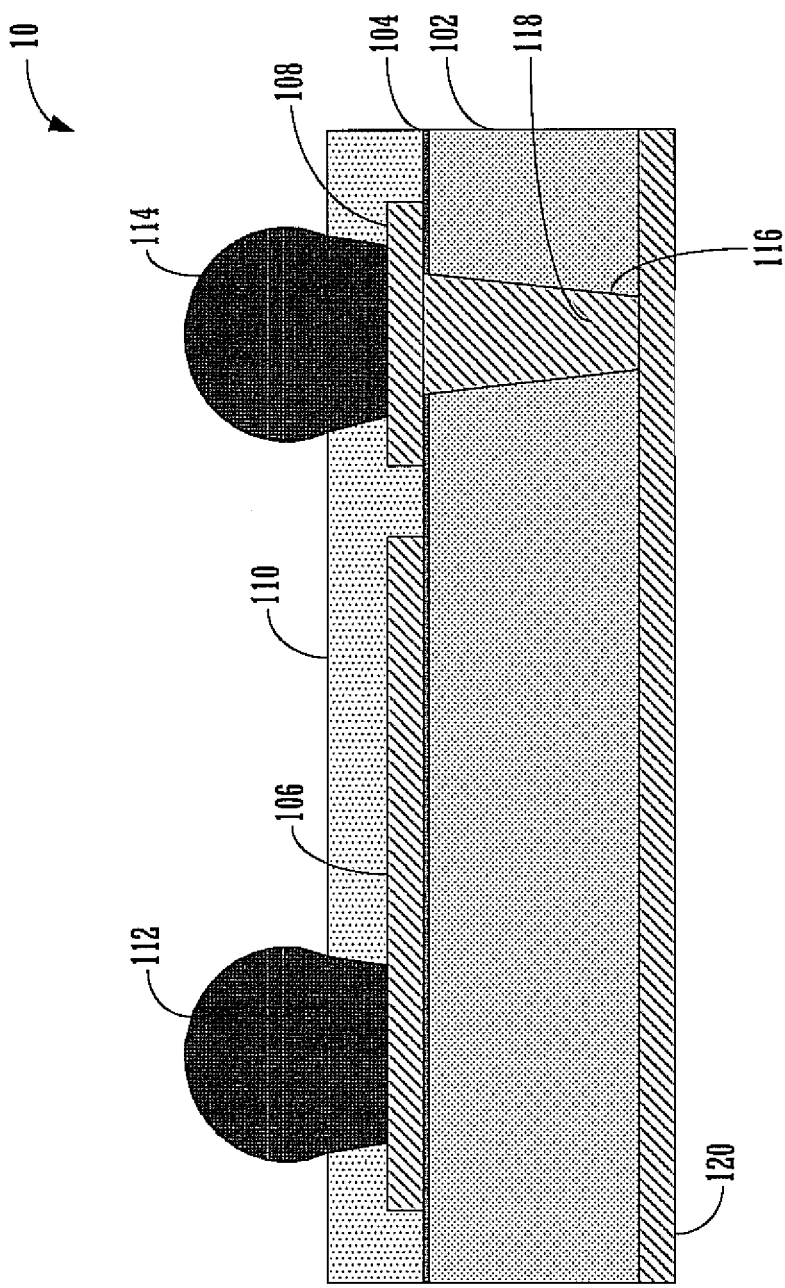
FIG. 1 is a cross-sectional view of a capacitor in accordance with the invention containing a via through the substrate.

FIG. 1 shows a cross-sectional view of a first embodiment according to the invention. Capacitor 10 is formed on an N+ silicon substrate 102. Substrate 102 may be doped to a concentration of 3 to $4 \times 10^{19}$ cm$^{-3}$, for example, and may have a resistivity of about 2 mΩ-cm and as high as about 3 mΩ-cm. A dielectric layer 104 is formed on the front surface of substrate 102. Dielectric layer 104 is formed of SiO$_2$ which may be thermally grown or deposited by chemical vapor deposition (CVD). Alternatively, layer 104 could be formed of another dielectric such as a nitride or a combination of an oxide and a nitride. A thermally-grown oxide is reliable and reproducible and can withstand electric fields up to 4 MV/cm without deterioration. The 3σ variability of the thickness of a thermally-grown oxide thicker than 0.1 µm is less than 1.5%.

On top of dielectric layer 104 is a main electrode 106 and a second electrode 108. Electrodes 106 and 108 can be a single- or multi-layer structure, and can be made of doped polysilicon, a refractory metal, a refractory metal suicide, an aluminum-based alloy, copper or combination of the foregoing materials. If they are formed of metal, electrode 106 may include a "seed" or "barrier" layer of a metal (e.g., Ta/Cu) deposited on substrate 102 by sputtering or evaporation, overlain by a plated layer. Electrodes 106 and 108 are covered by an insulating passivation layer 110. Openings are formed in passivation layer 110, and solder balls 112 and 114 are deposited the openings to allow electrical contact to be made to the electrodes 106 and 108.

Beneath the second electrode 108, a via or through-hole 116 is formed through N+ substrate 102. A conductive material 118 such as aluminum or copper fills the via 116. The conductive material 118 contacts a conductive layer 120 which is formed on the back side of substrate 102. Conductive layer 120 may include a metal seed layer deposited on substrate 102 by sputtering or evaporation, overlain by a plated metal layer.

Capacitor 10 thus includes a first "plate" represented by main electrode 106, which is contacted via solder ball 112; and a second "plate" represented by N+ substrate 102, which is contacted via solder ball 114, second electrode 108, conductive material 118 and conductive layer 120. The "plates" are separated by dielectric layer 104.

The thickness of dielectric layer 104 can be in the range of 50 to 2 µm. The thinner dielectric layer 104 is, the higher the capacitance. On the other hand, the thinner dielectric layer 104 is, the lower the maximum voltage that capacitor 10 can be exposed to without damaging dielectric layer 104. For example, if dielectric layer 104 is an oxide having a thickness of 0.1 µm, capacitor 10 would have a capacitance of roughly 350 pF/mm$^2$.

Silicon substrate 102 can have a thickness of 200 pin or less. Doping substrate 102 to a concentration higher than $1 \times 10^{19}$ cm$^{-3}$ keeps the effective series resistance (ESR) at a low level and avoids the formation of a depletion layer in the substrate. For example, the ESR for a silicon substrate doped to a concentration of $2 \times 10^{19}$ cm$^{-3}$ was only 2.4 mΩmm$^2$.

In addition, it is desirable that the Q factor of the capacitor be higher than 1000 at 1 MHz. The Q factor is defined by the following equation:

$$Q = \frac{X_C}{R_S}$$

where $X_c$ is the impedance and $R_s$ is the series resistance of the capacitor at a particular frequency.

Figure 1A:
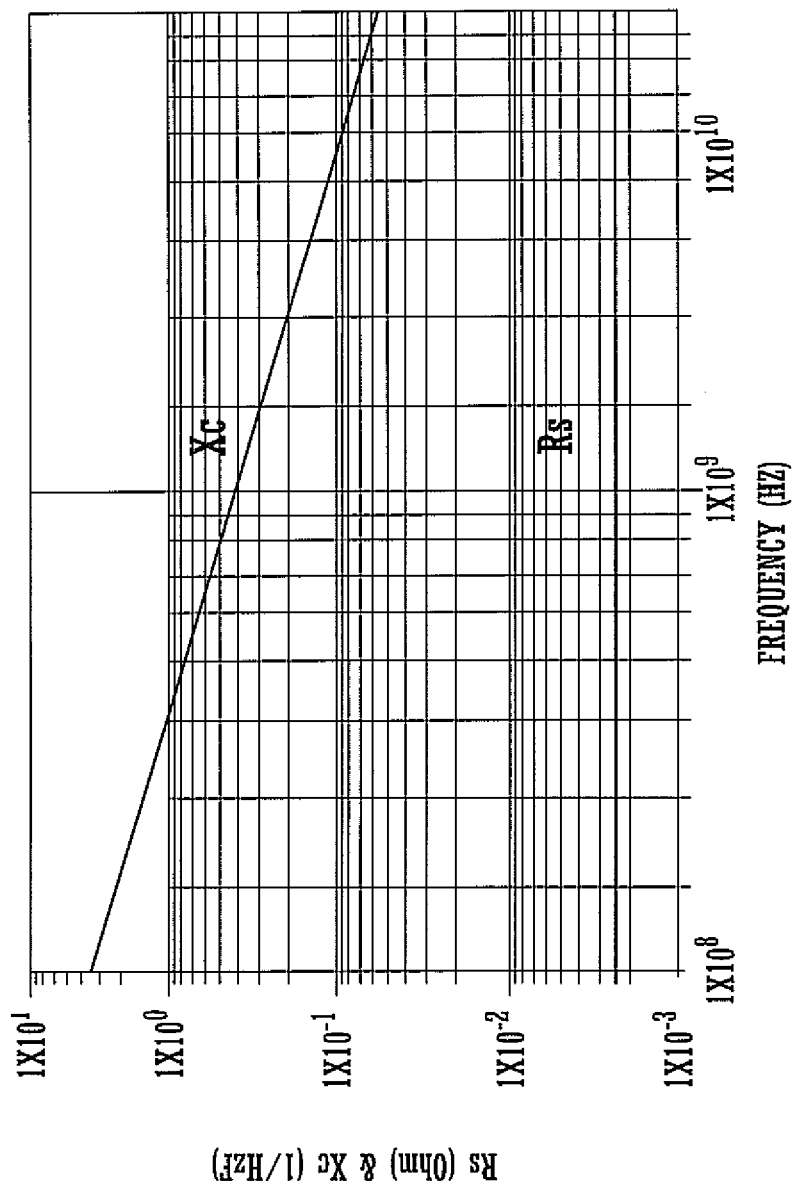
FIG. 1A is a graph showing the Q of a capacitor in accordance with this invention, i.e., the ratio of the imaginary part of the impedance to the real part of the impedance, as a function of frequency.

FIG. 1A is a plot of $X_c$ and $R_s$ as a function of frequency for capacitor 10, described above, wherein the thickness of the oxide dielectric layer 104 is 0.1 µm and the N+ silicon substrate is doped to $2 \times 10^{19}$ cm$^{-3}$. As shown, the Q factor of the capacitor is higher than 100 up to a frequency of about 2 GHz and is greater than 1000 at 100 MHz.

While capacitor 10 can be fabricated by a number of processes, FIGS. 2A-2J illustrate the steps of one process that may be used.

Figure 2A:
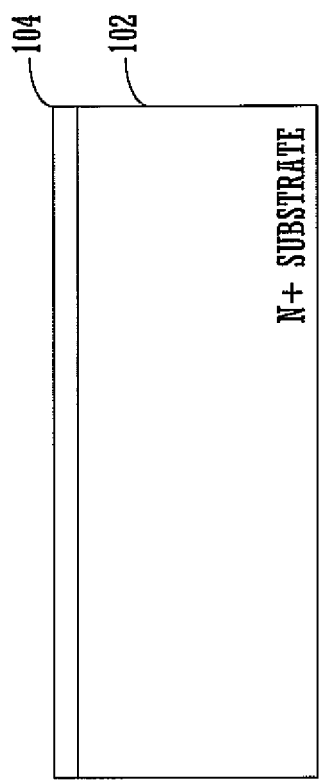

As shown in FIG. 2A, the process begins with N+ silicon substrate 102. Preferably, substrate 102 is one die of a wafer that will be separated from the other dice at the completion of the process. Substrate 102 may or may not include an epitaxial layer.

Dielectric layer 104 is formed by growing an oxide (SiO$_2$) layer thermally on the front (top) surface of substrate 102. For example, a 0.2 µm thick oxide layer can be grown by heating the substrate to 1100° C. for 6 minutes in a wet atmosphere.

Figure 2B:
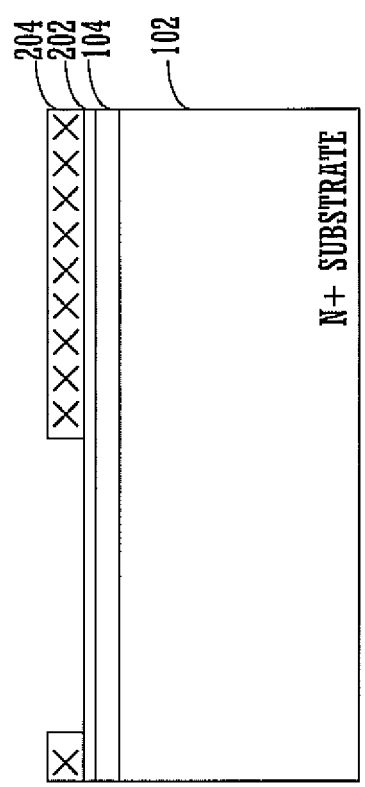
Figure 2C:
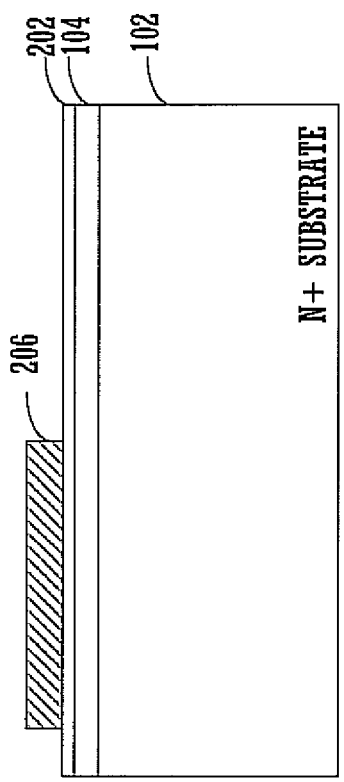
Figure 2D:
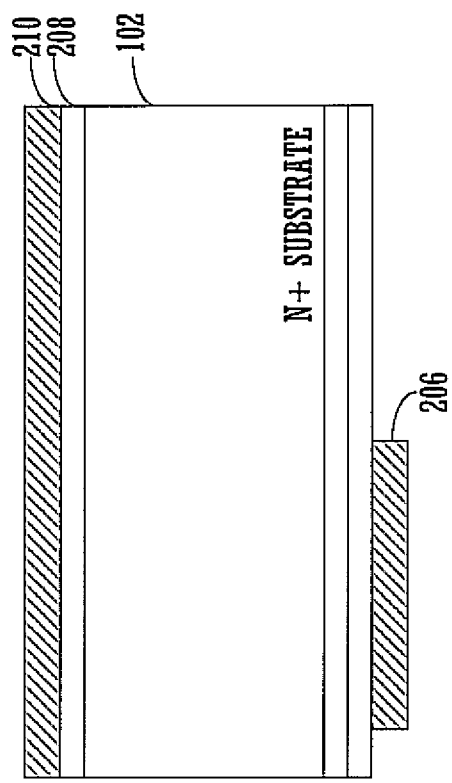

Referring to FIG. 2B, a barrier layer 202 of Ta/Cu is sputtered over the entire surface of oxide layer 104. Layer 202 can be 0.5 to 1.0 µm thick, for example. A photoresist layer 204 is deposited and patterned as shown in FIG. 2B to define where the main electrode will be located.

A copper layer 206 is plated onto the exposed portions of Ta/Cu layer 202, and photoresist layer 204 is removed, leaving the structure shown in FIG. 2O.

The front side of substrate 102 is then taped or otherwise supported, and substrate 102 is thinned from the back side. Substrate 102 may be thinned by grinding its back side. Alternatively, other thinning techniques such as wet etching and vacuum plasma etching can be used to thin substrate 102. Another possibility is the atmospheric downstream plasma (ADP) plasma etching system available from Tru-Si Technologies, Inc. of Sunnyvale, Calif. Substrate 102, which can initially be in the range of 625 µm thick, can be thinned to a thickness of less than 200 µm, for example.

After the thinning process has been completed, the tape or other support is removed. A layer 208 of Ta/Cu is sputtered or evaporated over the entire back side surface of substrate 102, and a copper layer 210 is plated onto Ta/Cu layer 208, leaving the structure shown in FIG. 2D. Copper layer 210 can be 2-3 µm thick, for example.

Figure 2E:
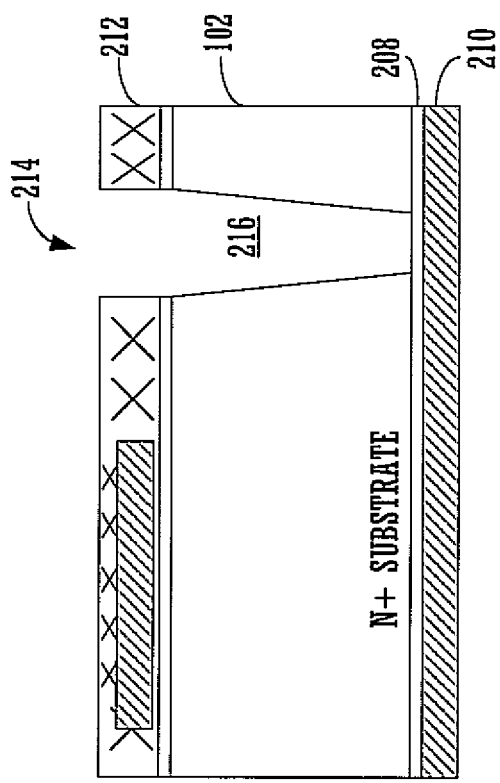

As shown in FIG. 2E, a photoresist layer 212 is deposited on the front side of silicon substrate 102. Photoresist layer 212 is patterned and etched to produce an opening 214. A conventional wet etch process can be used, for example. Silicon substrate 102 is etched through opening 214 to form a via 216 and thereby expose the surface of barrier layer 208, As shown in FIG. 2E, via 216 is conical in shape because silicon etches along oblique planes. Depending on the shape of opening 214, via 216 could be any shape.

Figure 2F:
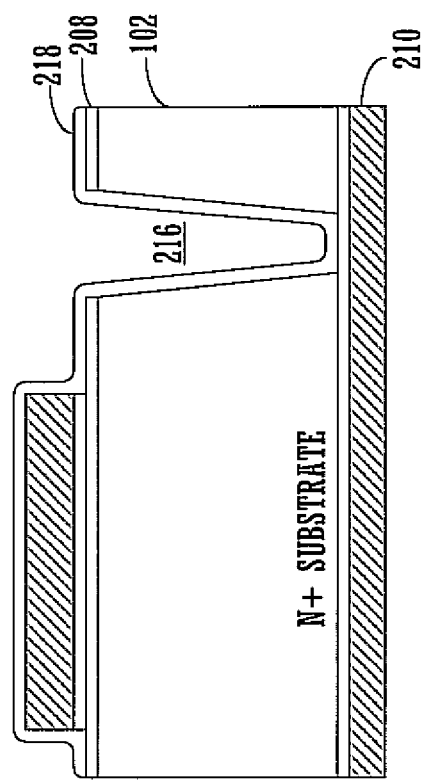

As shown in FIG. 2F, photoresist layer 212 is then removed, and a seed layer 218 of Ta/Cu is sputtered onto the entire front side surface of the structure. Ta/Cu layer 218 can be 0.5-1.0 µm thick, for example.

Figure 2G:
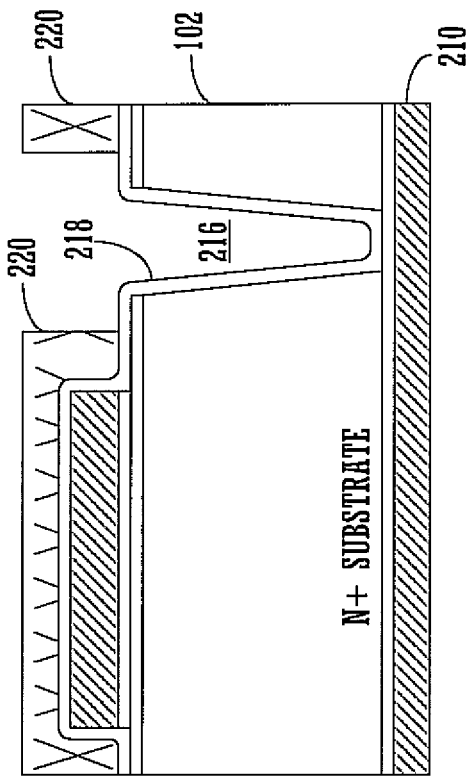

As shown in FIG. 2G, a photoresist layer 220 is deposited and patterned, leaving a portion of the Ta/Cu layer 218 in the vicinity of the via 216 exposed.

Figure 2H:
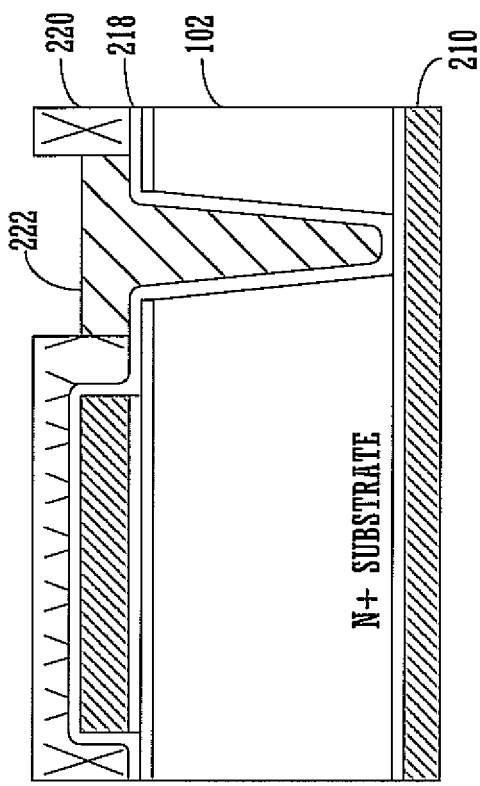
Figure 21:
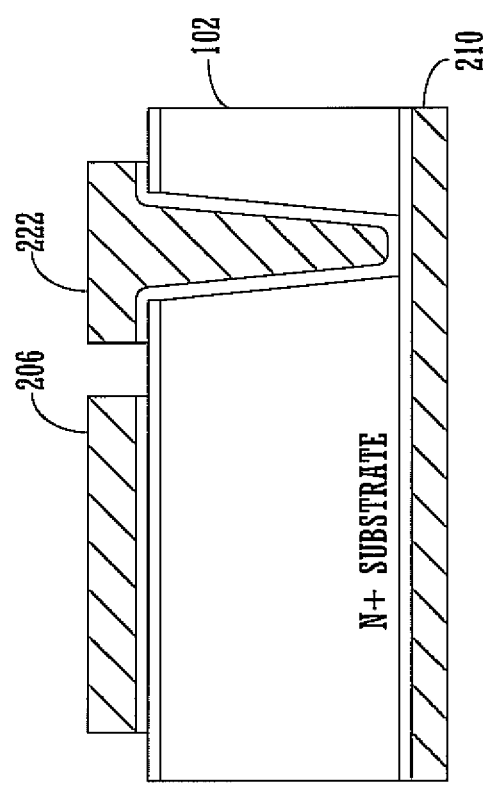

As shown in FIG. 2H, a copper layer 222 is plated onto the exposed portions of Ta/Cu layer 218, filling via 216 and overflowing onto the surface of substrate 102.

As shown in FIG. 2I, photoresist layer 220 is removed and Ta/Cu layer 218 is etched, leaving the copper layer 222 in place.

Figure 2J:
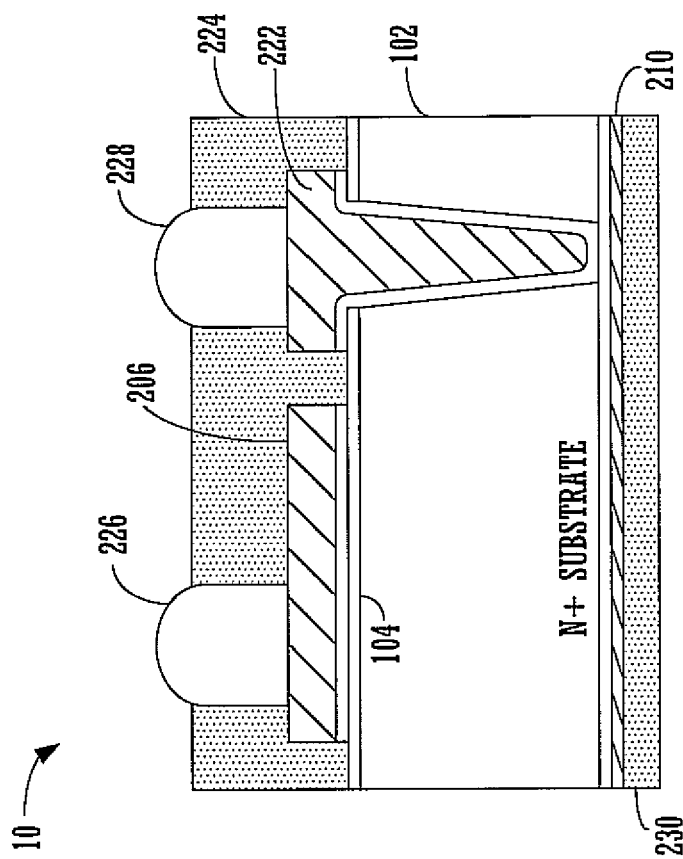

As shown in FIG. 2J, a passivation layer 224 is formed and patterned over the surface of the structure by screen printing, with openings that expose portions of copper layers 206 and 222. Solder bumps 226 and 228 are formed on the exposed portions of copper layers 206 and 222. The result is capacitor 10 shown in FIG. 1, which can be mounted on a printed circuit board (PCB) or other structure, using flip-chip mounting techniques. Optionally, a second passivation layer 230 can be formed on the back side of the structure.

Capacitor 10 is preferably formed along with other similar capacitors on a single wafer. If so, following the fabrication of the capacitors, the die which contains capacitor 10 is separated from the other dice in the wafer by sawing the wafer along the scribe lines.

Figure 3:
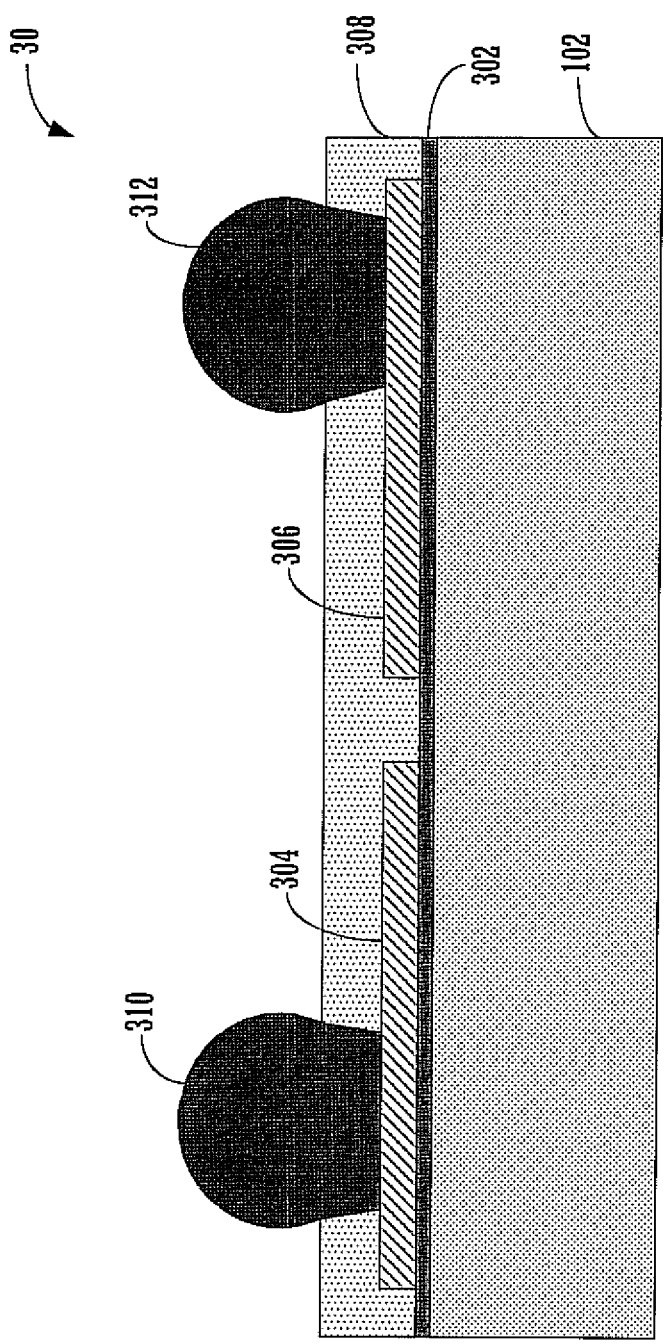
FIG. 3 is a cross-sectional view of a capacitor in accordance with this invention containing two electrodes on the same surface of the substrate.

FIG. 3 shows a cross-sectional view of an alternative embodiment. Capacitor 30 is actually a pair of capacitors connected in series. A dielectric layer 302 is formed on N+ silicon substrate 102. Substrate 102 could have a doping concentration of $2\times10^{19}$ cm$^{-3}$, for example, and layer 302 could be thermally-grown oxide with a thickness of 0.1 µm. A metal layer is deposited on dielectric layer 302 and is patterned, using normal photolithographic processes, to form a first electrode 304 and a second electrode 306. A passivation layer 308 is deposited on the top surface of the structure. Openings are formed in passivation layer 308, and solder balls 310 and 312 are formed as described above.

While capacitor 30 is simpler and less expensive to fabricate than, for example, capacitor 10 (FIG. 1), its capacitance is lower and its series resistance is greater. For example, the effective capacitance per unit area is up to 4 times smaller than that of a vertical structure. The series resistance increases with the square of the lateral dimension of the device.

Figure 4:
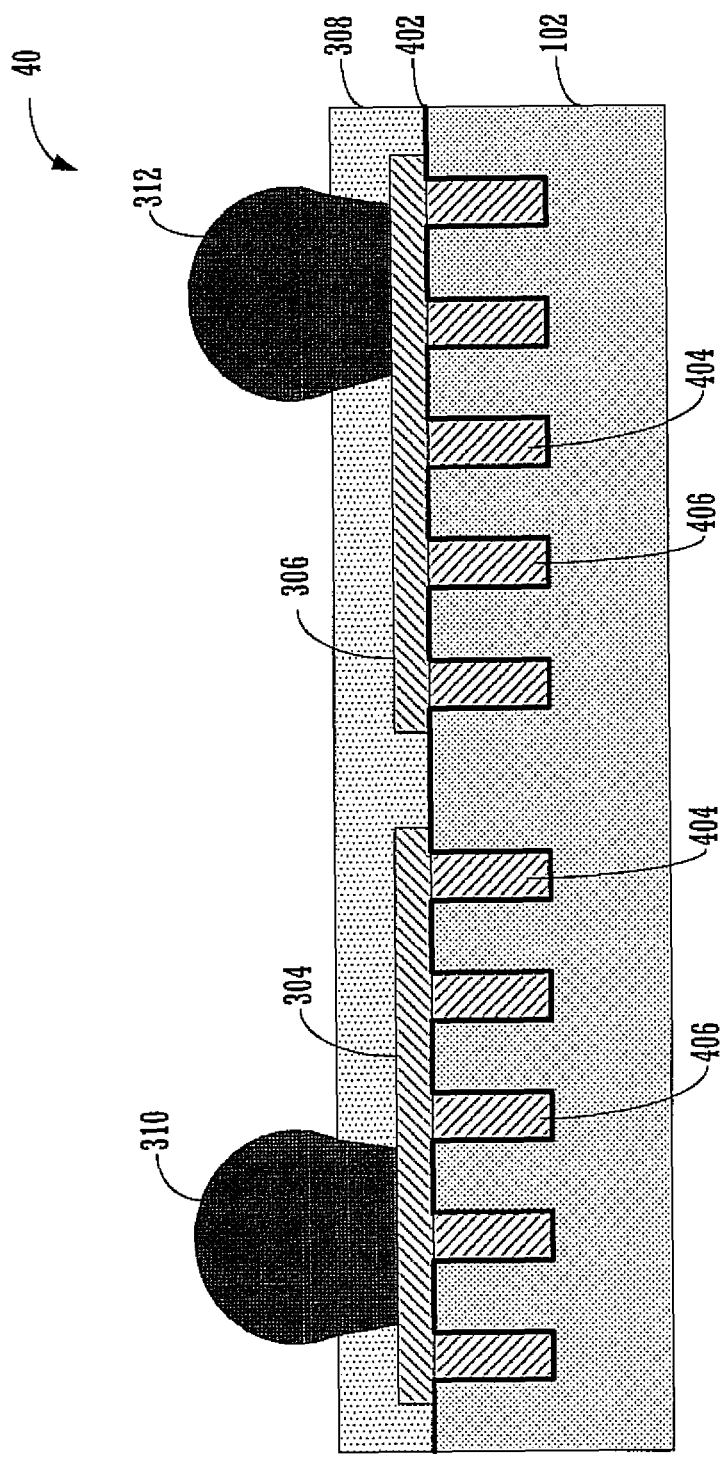
FIG. 4 is a cross-sectional view of a capacitor with trenches formed under each of the electrodes.

The capacitance per unit area of capacitor 40, shown in FIG. 4, is significantly increased by the formation of trenches 406 under electrodes 304 and 306. Dielectric layer 402 extends into trenches 304 and 306 and lines the walls thereof in the manner of a normal trench-gated MOSFET. Trenches 304 and 306 are filled with a conductive material 404, such as polysilicon, which is in electrical contact with electrodes 304 and 306. The net result is to increase the effective area of the interface between the "plates" and the dielectric layer of the capacitor.

Figure 5:
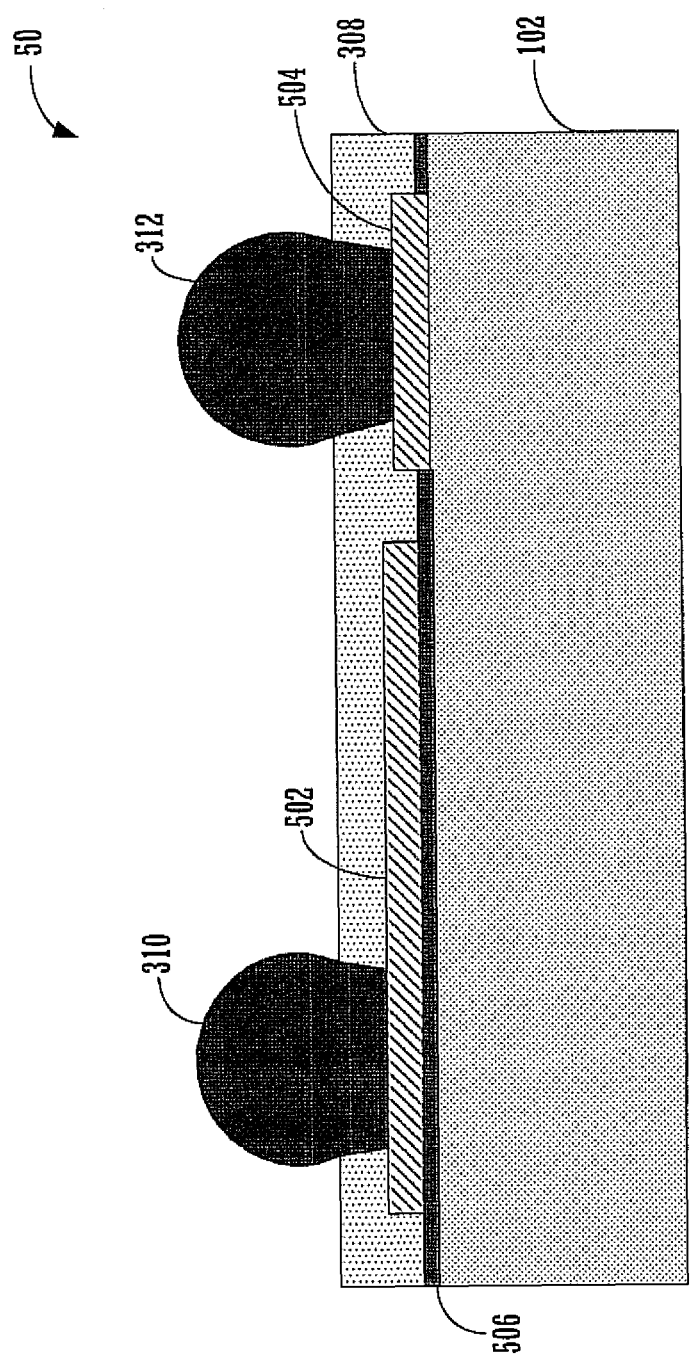
FIG. 5 is a cross-sectional view of a capacitor similar to the capacitor shown in FIG. 3 except that one of the electrodes is electrically connected to the substrate.

FIG. 5 shows a cross-sectional view of a capacitor 50 which is similar to capacitor 30 shown in FIG. 3 except that the electrode 504 is in electrical contact with the NI– substrate 102. Electrode 502 is separated from substrate 102 by a dielectric layer 506 having a defined thickness. Capacitor 50 has a capacitance value per unit area similar to that of capacitor 10 shown in FIG. 1. However, the lateral placement of electrodes 502 and 504 leads to a larger effective series resistance (ESR) which is a function of the lateral dimension of the device.

Figure 6:
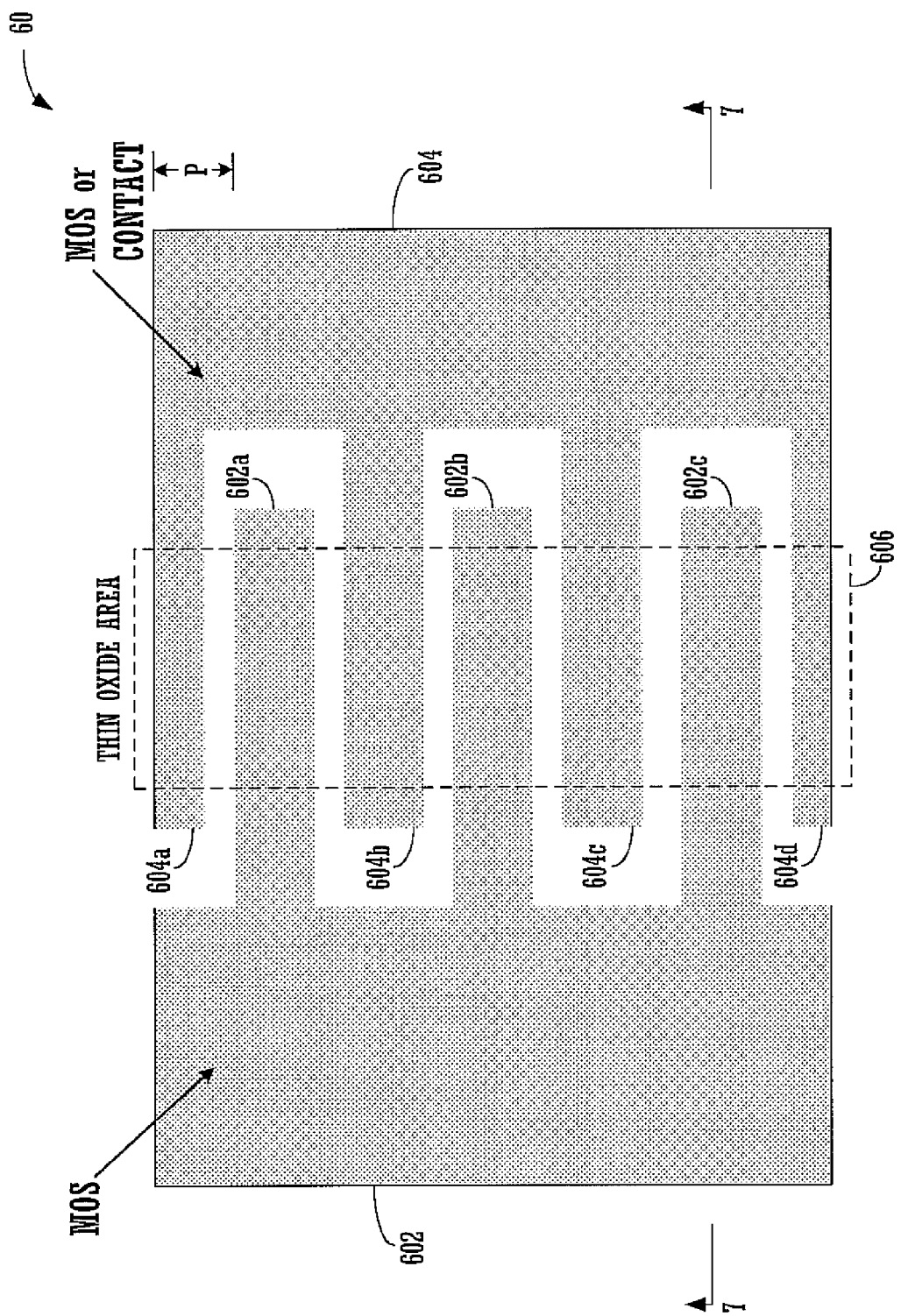
FIG. 6 is a top view of a capacitor wherein the electrodes have fingers interdigitated with each other.
Figure 7:
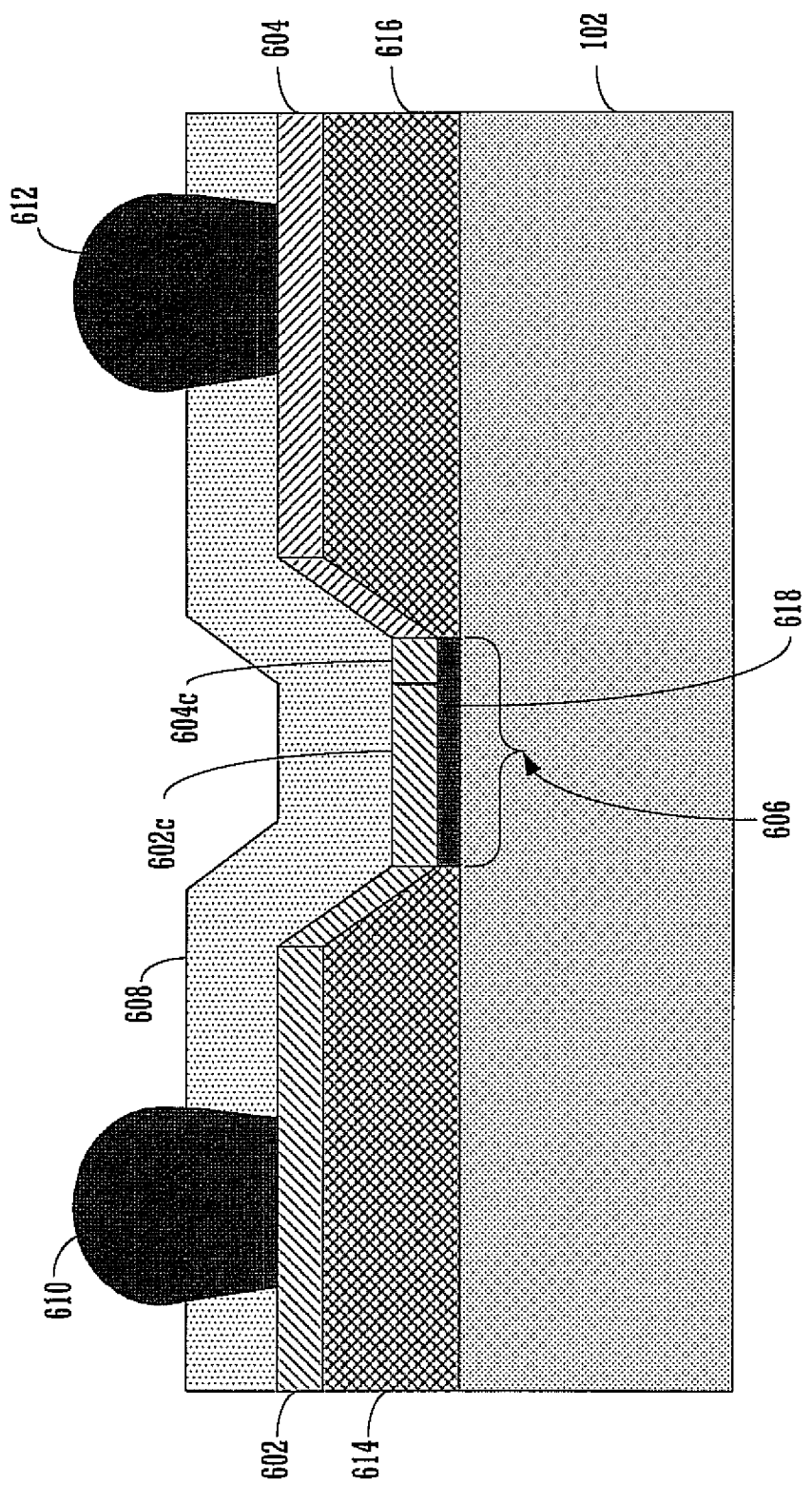
FIG. 7 is a cross-sectional view of the capacitor shown in FIG. 6 showing that the dielectric layer is thinner under the fingers.

FIG. 6 is a top view of a capacitor 60 in which the first electrode 602 has fingers 602a-602c that are interdigitated with fingers 604a-604d of the second electrode 604. FIG. 7 is a cross-sectional view taken at cross-section 7-7 shown in FIG. 6 (note that the scales of FIGS. 6 and 7 are not the same). In an active region 606, where the fingers are interdigitated, a thin dielectric layer 618 is formed over the substrate. A relatively thick dielectric layer 614 separates the remaining "palm" portion of electrode 602 from N+ substrate 102, and a relatively thick dielectric layer 616 separates the palm portion of electrode 604 from substrate 102.

The capacitance of capacitor 60 is determined by the number and dimensions of the fingers. As indicated in FIG. 6, electrode 604 can be separated from the N+ substrate by a dielectric layer, creating a pair of capacitors, or it can be in direct electrical contact with the N+ substrate (in the manner of electrode 504 in FIG. 5), creating a single capacitor. In many embodiments, the pitch "p" of the finger layout will be less than 300 µm. For example, a capacitor 60 wherein electrode 604 is in direct electrical contact with the substrate and the pitch of the interdigitated fingers is 250 µm (finger width of 200 µm, spacing of 50 µm) and the thin dielectric layer 618 is a 0.1 µm-thick oxide layer, has a capacitance of 150 pF/mm$^2$ and an ESR of 12 mΩmm$^2$.

Figure 8:
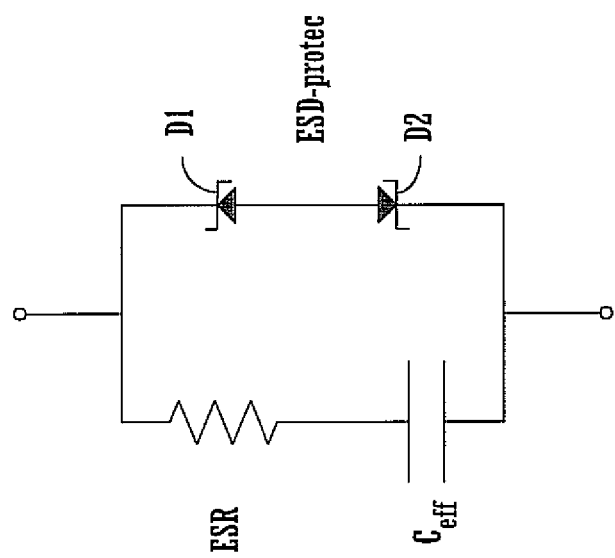
FIG. 8 is a circuit diagram of an ESD-protected capacitor containing a pair of oppositely-directed diodes.

The thin dielectric layers used in precision capacitors make these devices very susceptible to damage from electrostatic discharges (ESDs). For example, ESDs can be generated by handling during the assembly process. One way to protect against ESDs is to connect a pair of oppositely-directed Zener diodes D1, D2 in parallel with the capacitor, as shown in the circuit diagram of FIG. 8. When an ESD voltage spike occurs, one of the diodes conducts in the forward direction and the other diode breaks down at a predetermined voltage and conducts in the reverse direction, thereby providing a current path around the capacitor. The voltage at which current flows in the protective path is equal to the reverse breakdown voltage of one diode plus the voltage at which the other diode conducts in the forward direction (typically about 0.5 V). (As used herein, the term "oppositely-directed" means that the diodes are connected in series with either their anodes facing each other or their cathodes facing each other, such that any current in the series path flows through one of the diodes in the forward direction and through the other diode in the reverse direction.)

Figure 9:
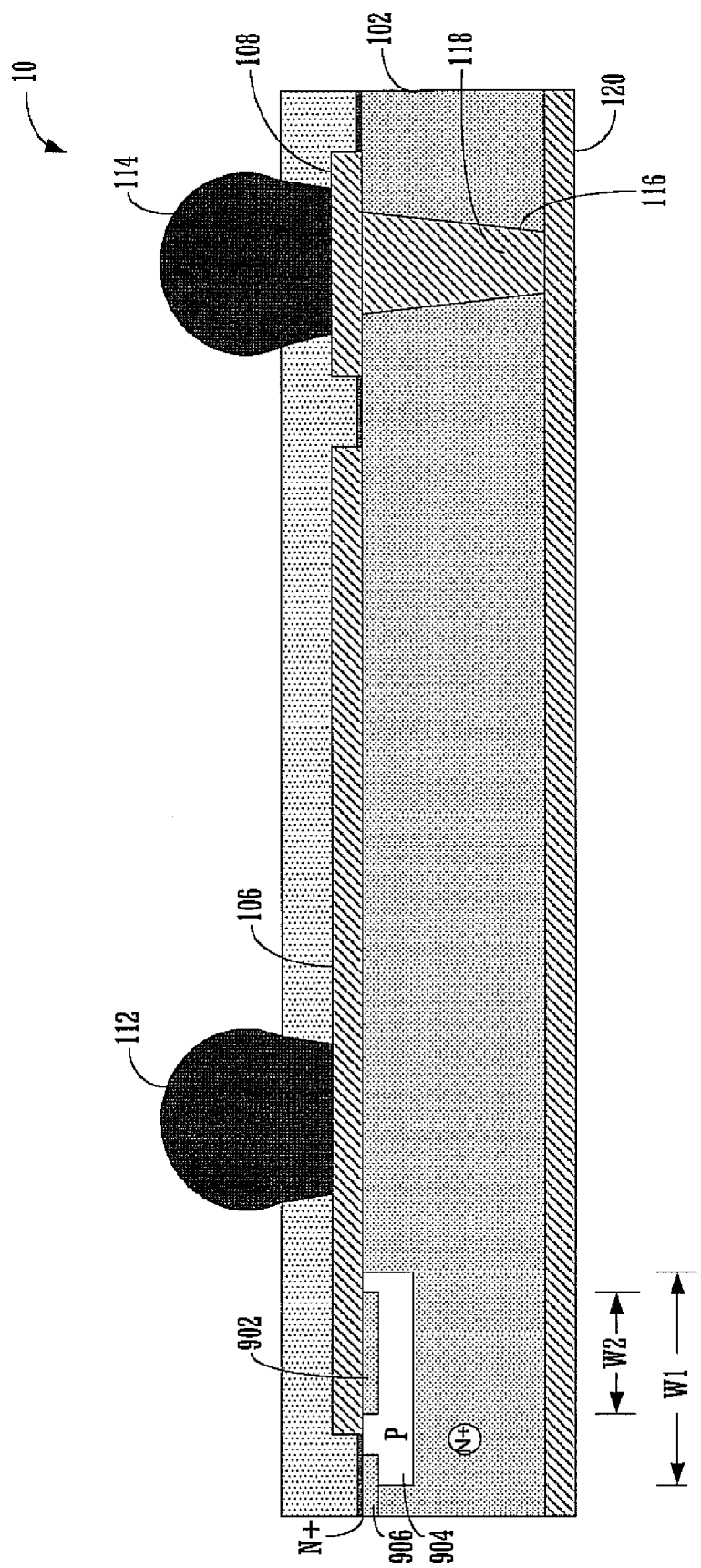
FIG. 9 is a cross-sectional view of an ESD-protected capacitor in accordance with this invention.

In accordance with an aspect of this invention, the protective diodes can be formed in the substrate itself, as shown in the ESD-protected capacitor arrangement of FIG. 9. An N+ region 902, a P region 904 and an N+ region 906 are formed in substrate 102 beneath electrode 106. The regions are formed such that there is a first PN junction between N+ region 902 and P region 904 that represents one of the diodes and a second PN junction between P region 904 and N+ region 906 that represents the other diode. The doping concentrations of regions 902, 904 and 906 are set such that the PN junctions break down in the reverse direction at a desired voltage. The breakdown voltage depends on the doping concentration on the more lightly doped side of the PN junction and other factors that are well-known in the art. See, for example, Sze, *Physics of Semiconductor Devices*, 2$^{nd}$ Ed., John Wiley & Sons (1981), pp. 99-108, which is incorporated herein by reference.

The second N+ region 906, which extends into the P region 904 as well as the N+ substrate, is used to provide a symmetrical breakdown characteristic of the diode pair. In some embodiments, N+ region 906 may be omitted.

To maintain the high RF performance capabilities of the capacitor, the impedance of the Zener diodes can be set at a level that is higher than the capacitor by a factor of 1000 or more.

Processes for forming the diodes in the substrate are well known to those skilled in the art. One such process is as follows:

1. Initially, an N-type epitaxial (epi) layer that is 2.5 µm thick is formed on the top surface of the substrate. The doping concentration of the epi layer is $1\times10^{16}$ cm$^{-3}$, far less than that of the underlying portion of the substrate.

2. A first photoresist mask with an opening defining the active area where the capacitor will be located is formed over the epi layer, and phosphorus is implanted through the opening in the mask at a dose of $8\times10^{15}$ cm$^{-2}$ and an energy of 80 keV to set the doping concentration of the epi layer to approximately the same level as the rest of the N+ substrate ($10^{19}$ cm$^{-3}$). The first mask is then removed.

3. After the phosphorus implant into the active area through the first mask, another mask is formed over the substrate with an opening defining where P region 904 will be located. Boron is implanted through the opening in this mask, for example, at a dose of $2\times10^{13}$ cm$^{-2}$ and an energy of 80 keV, to form P region 904.

4. The substrate is annealed at 1150° C. for 30 minutes to drive the phosphorus and boron implants through the epi layer.

5. The oxide dielectric layer 104 is thermally grown as described above.

6. After the oxide layer has been grown, a third photoresist mask is formed on the oxide layer and patterned to create openings which define the N+ regions 902 and 906.

7. The oxide layer is partially etched through the openings in the third photoresist mask to avoid the need to implant dopant through a thick oxide film.

8. Phosphorus is then implanted through the openings in the third mask and the thinned oxide layer at, for example, a dose of $3 \times 10^{15}$ cm$^{-2}$ and an energy of 60 keV to form N+ regions 902 and 906.

9. The third photoresist mask is removed, and a blanket boron implant is performed through the oxide layer to set a surface doping of the P-well. This can be done, for example, at a dose of $3 \times 10^{12}$ cm$^{-2}$ and an energy of 60 keV. The boron dopant can be activated by annealing at 950° C. for 30 minutes in an oxidizing ambient.

10. A fourth photoresist mask is formed and patterned with an opening over the area where contact is to be made to the N+ region 902. The oxide layer is etched through the opening to expose N+ region 902. The fourth mask is then removed.

Following this, the process described above continues with the formation of the electrodes 106 and 108.

Figure 10A:
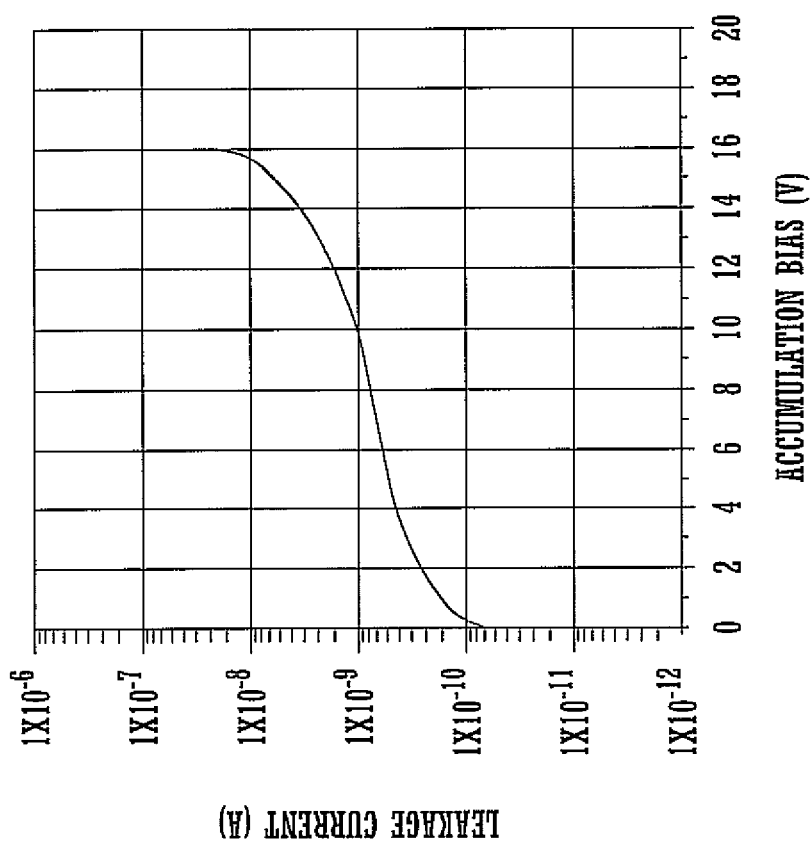
FIGS. 10a and 10b are graphs showing simulated breakdown characteristics of an ESD-protected capacitor of the kind shown in FIG. 9.
Figure 10B:
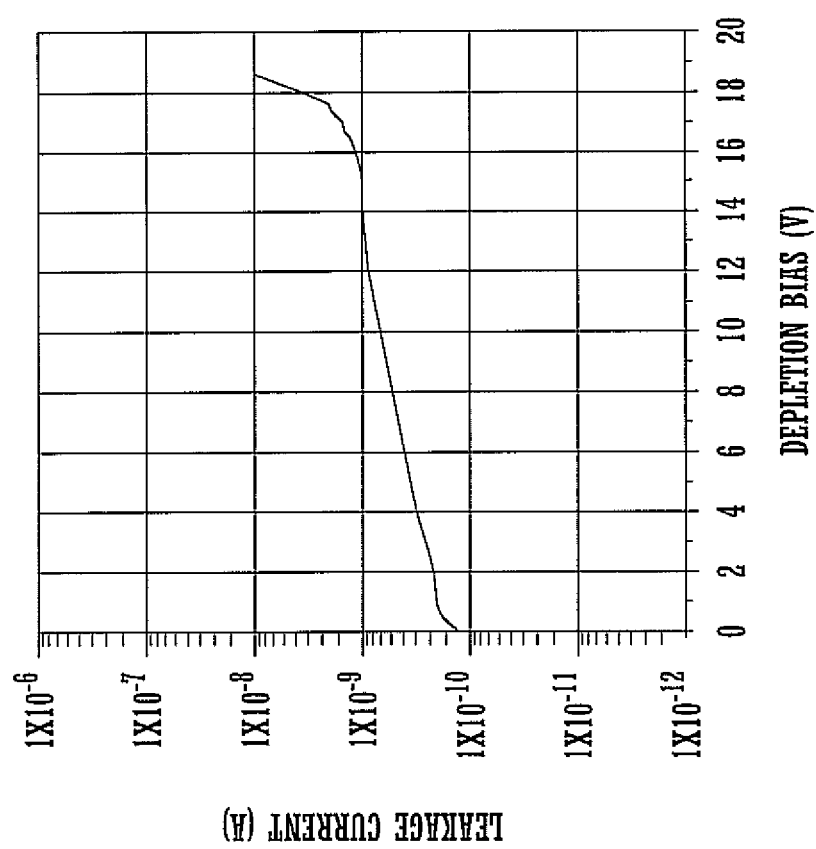
Figure 11:
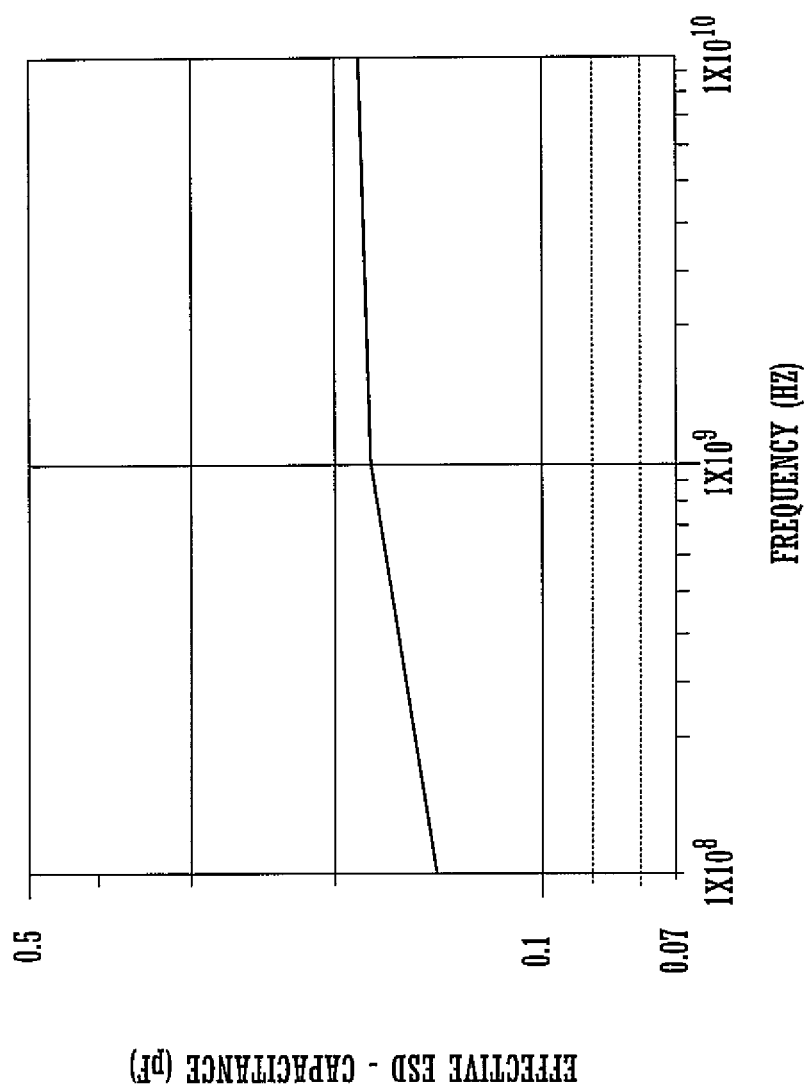
FIG. 11 is a graph showing the simulated effective capacitance of the ESD-protected capacitor.

Numerical simulations were done to calculate the performance of the ESD-protection structure shown in FIG. 9. The dimensions of the structure were as follows:

Width (W1) of P region 904: 5 μm
Width (W2) of N+ region 902: 3 μm
Length of structure: 100 μm FIG. 10*a* shows the IV characteristic of the structure with electrode 106 biased positive with respect to electrode 114 ("accumulation bias"), and FIG. 10*b* shows the IV characteristic of the structure with electrode 106 biased negative with respect to electrode 114 ("depletion bias"). As indicated, the diode pair breaks down in the range of 16-19 V in either direction. FIG. 11 shows that the effective capacitance of the combined capacitor and ESD-structure remains quite constant at about 0.15 pF throughout the frequency range from 0.1 to 10 GHz.

The embodiments of this invention described above are only illustrative, and not limiting. Numerous alternative embodiments will be apparent to persons skilled in the art from the above description.

What is claimed is:

1. A method of fabricating a capacitor in a semiconductor substrate comprising a first surface and a second surface, said method comprising:
   forming a first dielectric layer directly on a first portion of said first surface of said semiconductor substrate;
   forming a first electrode layer directly over said first dielectric layer, wherein said first electrode layer is electrically insulated from said semiconductor substrate;
   forming a second dielectric layer directly on a second portion of said first surface of said semiconductor substrate, wherein said first dielectric layer is separated from said second dielectric layer;
   forming a second electrode layer directly over said second dielectric layer, wherein said first electrode, said second electrode, said first dielectric layer and said second dielectric layer form a plurality of capacitors in series, and wherein said first and said second electrode layers comprise a plurality of fingers, and wherein a first portion of said first electrode layer is interdigitated with a second portion of said second electrode layer.

2. The method as described in claim 1, wherein the doping concentration of said semiconductor substrate is greater than $1 \times 10^{19}$ cm$^{-3}$.

3. The method as described in claim 1, wherein the thickness of said semiconductor substrate is less than 200 microns.

4. The method as described in claim 1, wherein the first dielectric layer comprises an oxide.

5. The method as described in claim 1, wherein the thickness of said first dielectric layer is greater than or equal to 0.005 microns.

6. The method as described in claim 1 further comprising:
   forming a passivation layer overlying said first electrode and said second electrode wherein a first opening is formed in said passivation layer over said first electrode and a second opening is formed in the passivation layer over said second electrode.

7. The method as described in claim 6 further comprising:
   forming a first metal ball in said first opening, wherein said first metal ball is electrically coupled to said first electrode; and
   forming a second metal ball in said second opening, wherein said second metal ball is electrically coupled to said second electrode.

8. The method as described in claim 1 further comprising:
   forming at least one trench under said first electrode and said second electrode, and wherein a portion of said first dielectric covers a sidewall of said at least one trench.

9. A capacitor comprising:
   a first dielectric layer formed directly on a first portion of said first surface of said semiconductor substrate;
   a first electrode layer formed directly over said first dielectric layer, wherein said first electrode layer is electrically insulated from said semiconductor substrate;
   a second dielectric layer formed directly on a second portion of said first surface of said semiconductor substrate, wherein said first dielectric layer is separated from said second dielectric layer; and
   a second electrode layer formed directly over said second dielectric layer, wherein said first electrode, said second electrode, said first dielectric layer and said second dielectric layer form a plurality of capacitors in series, and wherein said first and said second electrode layers comprise a plurality of fingers, and wherein a first portion of said first electrode layer is interdigitated with a second portion of said second electrode layer.

10. The capacitor as described in claim 9 further comprising:
    at least one trench formed under said first electrode and said second electrode, and wherein said trench is filled with a conductive material.

11. The capacitor as described in claim 10 wherein said conductive material is in electrical contact with said first electrode.

12. The capacitor as described in claim 10 wherein said conductive material is polysilicon.

13. The capacitor as described in claim 9 further comprising:
    a passivation layer formed over said first electrode and said second electrode wherein said passivation layer comprises a first opening over said first electrode and a second opening over said second electrode.

14. The capacitor as described in claim 13 further comprising:

a first metal ball formed in said first opening, wherein said first metal ball is electrically coupled to said first electrode; and a second metal ball formed in said second opening, wherein said second metal ball is electrically coupled to said second electrode.

15. A method of fabricating a capacitor in a semiconductor substrate comprising a first surface and a second surface, said method comprising:

forming a first dielectric layer directly on a first portion of said first surface of said semiconductor substrate;

forming a first electrode layer directly over said first dielectric layer, wherein said first electrode layer is electrically insulated from said semiconductor substrate;

forming a second dielectric layer directly on a second portion of said first surface of said semiconductor substrate, wherein said first dielectric layer is separated from said second dielectric layer;

forming a second electrode layer directly over said second dielectric layer, wherein said first electrode, said second electrode, said first dielectric layer and said second dielectric layer form a plurality of capacitors in series, wherein a first portion of said first electrode layer is interdigitated with a second portion of said second electrode layer; and forming a passivation layer above said first electrode and said second electrode.

16. The method as described in claim 15 further comprising:

forming a first opening in said passivation layer over said first electrode; and forming a second opening in the passivation layer over said second electrode.

17. The method as described in claim 15 further comprising:

forming at least one trench under said first electrode and said second electrode, and wherein a portion of said first dielectric layer covers a sidewall of said at least one trench.

18. The method as described in claim 17 wherein said at least one trench is filled with a conductive material.

* * * * *